US011152365B2

(12) United States Patent
Jeon et al.

(10) Patent No.: US 11,152,365 B2
(45) Date of Patent: Oct. 19, 2021

(54) SEMICONDUCTOR MEMORY DEVICE INCLUDING WORK FUNCTION ADJUSTING LAYER IN BURIED GATE LINE AND METHOD OF MANUFACTURING THE SAME

(71) Applicant: SAMSUNG ELECTRONICS CO., LTD., Suwon-si (KR)

(72) Inventors: Namho Jeon, Hwaseong-si (KR); Jin-Seong Lee, Gyeonggi-do (KR); Hyun-jung Lee, Seongnam-si (KR); Dongsoo Woo, Seoul (KR); Donggyu Heo, Suwon-si (KR); Jaeho Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 8 days.

(21) Appl. No.: 15/966,554

(22) Filed: Apr. 30, 2018

(65) Prior Publication Data

US 2019/0115351 A1 Apr. 18, 2019

(30) Foreign Application Priority Data

Oct. 16, 2017 (KR) ........................ 10-2017-0134232

(51) Int. Cl.
*H01L 27/105* (2006.01)
*H01L 29/06* (2006.01)
(Continued)

(52) U.S. Cl.
CPC ...... *H01L 27/1052* (2013.01); *H01L 21/8239* (2013.01); *H01L 21/823842* (2013.01);
(Continued)

(58) Field of Classification Search
CPC .......... H01L 27/1052; H01L 27/10897; H01L 27/10894; H01L 27/10814; H01L 27/10888; H01L 27/10885; H01L 27/10876; H01L 27/10855; H01L 27/10823; H01L 27/10817; H01L 27/10891; H01L 21/823842; H01L 21/8239; H01L 29/0649
See application file for complete search history.

(56) References Cited

U.S. PATENT DOCUMENTS 8,173,606 B2 5/2012 Jung et al.
8,901,630 B2 12/2014 Huh et al.
(Continued)

*Primary Examiner* — Thao X Le
*Assistant Examiner* — Gardner W. S. Swan
(74) *Attorney, Agent, or Firm* — F. Chau & Associates, LLC

(57) ABSTRACT

Disclosed are a semiconductor memory device and a method of manufacturing the same. The semiconductor memory device includes a device isolation layer defining active regions of a substrate, and gate lines buried in the substrate and extending across the active regions. Each of the gate lines includes a conductive layer, a liner layer disposed between and separating the conductive layer and the substrate, and a first work function adjusting layer disposed on the conductive layer and the liner layer. The first work function adjusting layer includes a first work function adjusting material. A work function of the first work function adjusting layer is less than those of the conductive layer and the liner layer.

1 Claim, 16 Drawing Sheets

(51) Int. Cl.
*H01L 21/8238* (2006.01)
*H01L 21/8239* (2006.01)
*H01L 27/108* (2006.01)

(52) U.S. Cl.
CPC .. *H01L 27/10814* (2013.01); *H01L 27/10817* (2013.01); *H01L 27/10823* (2013.01); *H01L 27/10855* (2013.01); *H01L 27/10876* (2013.01); *H01L 27/10885* (2013.01); *H01L 27/10888* (2013.01); *H01L 27/10891* (2013.01); *H01L 27/10894* (2013.01); *H01L 27/10897* (2013.01); *H01L 29/0649* (2013.01)

(56) References Cited

U.S. PATENT DOCUMENTS

| | | | |
|---|---|---|---|
| 9,384,986 B2 | 7/2016 | Yin et al. | |
| 9,543,433 B2 | 1/2017 | Anathan et al. | |
| 9,583,362 B2 | 2/2017 | Ho et al. | |
| 9,583,485 B2 | 2/2017 | Chang et al. | |
| 9,590,065 B2 | 3/2017 | Lee et al. | |
| 9,634,011 B2 | 4/2017 | Kang et al. | |
| 9,634,109 B2 | 4/2017 | Oh et al. | |
| 9,704,961 B2 | 7/2017 | Jang | |
| 9,704,988 B2 | 7/2017 | Oh | |
| 9,748,248 B2 | 8/2017 | Kang | |
| 9,793,368 B2 | 10/2017 | Son et al. | |
| 2013/0043519 A1* | 2/2013 | Moon | H01L 29/4236 257/296 |
| 2013/0277748 A1* | 10/2013 | Lee | H01L 27/0886 257/368 |
| 2014/0197484 A1* | 7/2014 | Anathan | H01L 29/66621 257/330 |
| 2014/0367774 A1* | 12/2014 | Yoo | H01L 29/4236 257/330 |
| 2015/0349073 A1* | 12/2015 | Kang | H01L 29/66795 257/330 |
| 2016/0149030 A1* | 5/2016 | Kim | H01L 29/785 257/337 |
| 2016/0260813 A1* | 9/2016 | Cho | H01L 29/513 |
| 2017/0084815 A1 | 3/2017 | Lee et al. | |
| 2017/0365608 A1* | 12/2017 | Lee | H01L 21/28088 |
| 2018/0174845 A1* | 6/2018 | Jang | H01L 29/78 |
| 2018/0301540 A1* | 10/2018 | Ando | H01L 29/517 |
| 2018/0342518 A1* | 11/2018 | Kim | H01L 21/76224 |

* cited by examiner

SEMICONDUCTOR MEMORY DEVICE INCLUDING WORK FUNCTION ADJUSTING LAYER IN BURIED GATE LINE AND METHOD OF MANUFACTURING THE SAME

CROSS-REFERENCE TO RELATED APPLICATIONS

This U.S. nonprovisional patent application claims priority under 35 U.S.C. § 119 to Korean Patent Application No. 10-2017-0134232, filed on Oct. 16, 2017, in the Korean Intellectual Property Office, the entire contents of which are herein incorporated by reference.

TECHNICAL FIELD

Exemplary embodiments of the present inventive concept relate to a semiconductor memory device and a method of manufacturing the same, and more particularly, to a semiconductor memory device including buried gate lines and a method of manufacturing the same.

DISCUSSION OF RELATED ART

Semiconductor devices are commonly used in the electronic industry because of their small size, multi-functionality, and/or low fabrication cost, and may be categorized as any one of semiconductor memory devices storing logic data, semiconductor logic devices processing operations of logic data, and hybrid semiconductor devices having both memory element for storing logic data and logic element for processing operations of logic data.

Recently, to obtain electronic products having high speed and low power consumption, the semiconductor devices embedded in the electronic products are usually required to have high operating speed and/or lower operating voltage. As a result, semiconductor devices have become more highly integrated. The high integration of semiconductor devices may cause the reliability of the semiconductor devices to deteriorate. However, the high reliability of semiconductor devices has been increasingly required with the advance in the electronic industry. Therefore, a variety of research has been conducted for enhancing the reliability of semiconductor devices.

SUMMARY

Exemplary embodiments of the present inventive concept provide a semiconductor memory device having enhanced electrical characteristics and a method of manufacturing the same.

According to an exemplary embodiment of the present inventive concept, a semiconductor memory device may include: a device isolation layer defining active regions of a substrate; and gate lines buried in the substrate and extending across the active regions. Each of the gate lines may include: a conductive layer; a liner layer disposed between and separating the conductive layer and the substrate; and a first work function adjusting layer disposed on the conductive layer and the liner layer, the first work function adjusting layer including a first work function adjusting material. A work function of the first work function adjusting layer may be less than those of the conductive layer and the liner layer.

According to an exemplary embodiment of the present inventive concept, a method of manufacturing a semiconductor memory device may include: forming in a substrate a device isolation layer defining active regions; forming in the substrate a trench extending across the active regions; forming in a lower portion of the trench a liner layer covering floor and inner sidewall surfaces of the trench; forming on the liner layer a conductive layer filling the lower portion of the trench; depositing a preliminary first work function adjusting layer on the conductive layer and the liner layer; forming a source material layer on a top surface of the preliminary first work function adjusting layer and the inner sidewall surface of the trench, the source material layer including a first work function adjusting material; diffusing the first work function adjusting material from the source material layer into the preliminary first work function adjusting layer to form a first work function adjusting layer; and removing the source material layer.

According to an exemplary embodiment of the present inventive concept, a semiconductor memory device may include: a substrate including a device isolation layer that defines active regions arranged along a first direction; gate lines buried in a trench in an upper portion of the substrate and extending across the active regions in a second direction intersecting the first direction, the gate lines separating the active regions into first doping regions and second doping regions; and a bit line disposed on the gate lines and extending in a third direction intersecting the first and second directions. Each of the gate lines may include: a liner layer disposed on a lower portion of the trench and extending along a floor surface of the trench and a sidewall of the trench; a conductive layer disposed on the liner layer and filling the lower portion of the trench; and a work function adjusting layer disposed on the liner layer and the conductive layer. The liner layer and the work function adjusting layer may include metal nitride. The work function adjusting layer may further include a work function adjusting material different from a metallic material of the metal nitride.

BRIEF DESCRIPTION OF THE DRAWINGS

The above and other features of the present inventive concept will become more apparent by describing in detail exemplary embodiments thereof, with reference to the accompanying drawings, in which.

Figure 1:
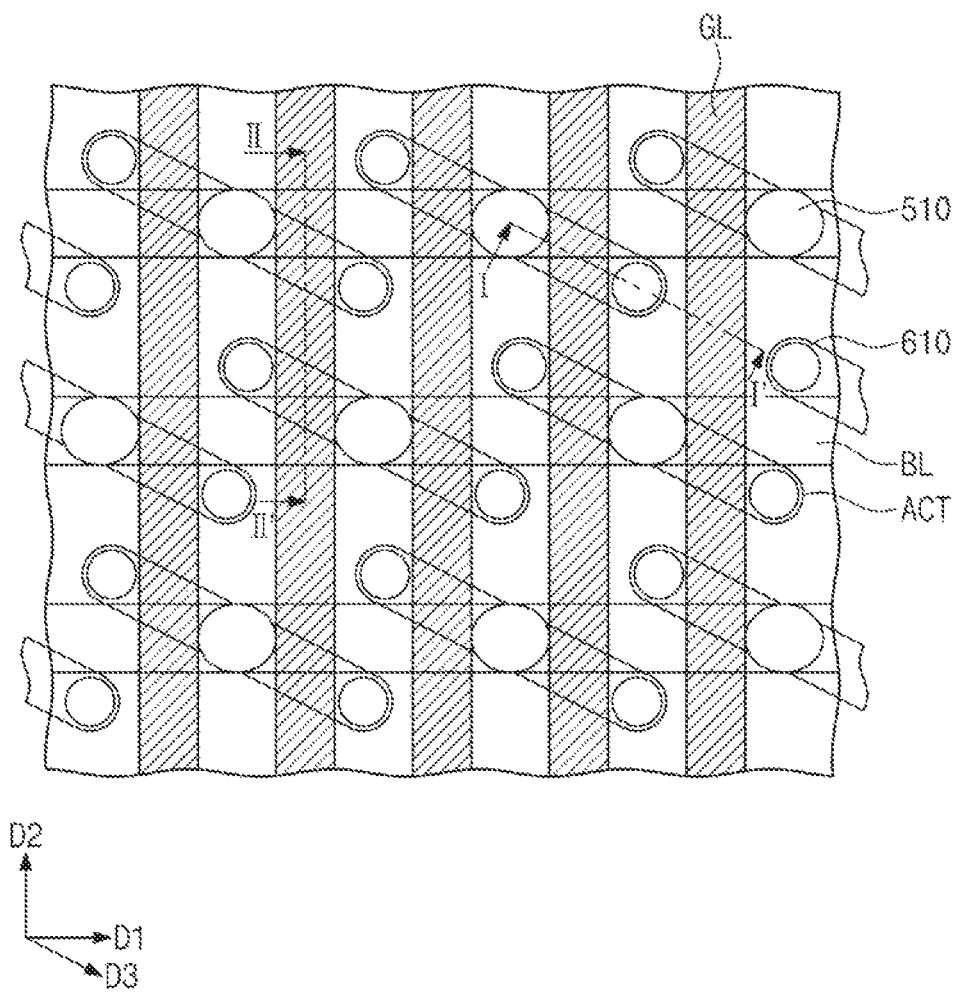
FIG. 1 is a plan view showing a semiconductor memory device according to an exemplary embodiment of the present inventive concept.

Since the drawings in FIGS. 1-15 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Exemplary embodiments of the present inventive concept relate to a semiconductor memory device will be hereinafter described with reference to accompanying drawings.

Figure 2A:
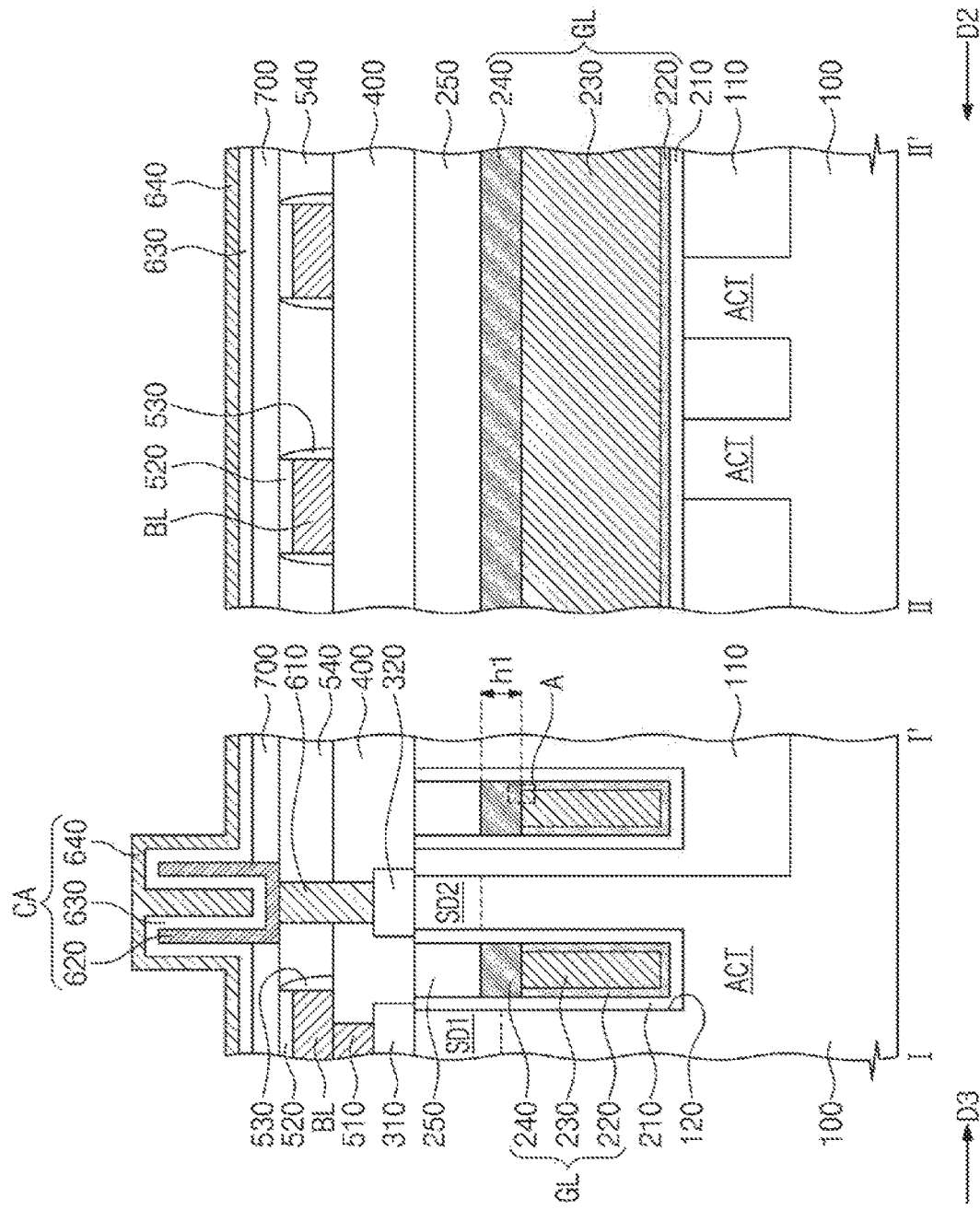
FIG. 2A is a cross-sectional view showing a semiconductor memory device according to an exemplary embodiment of the present inventive concept.
Figure 2B:
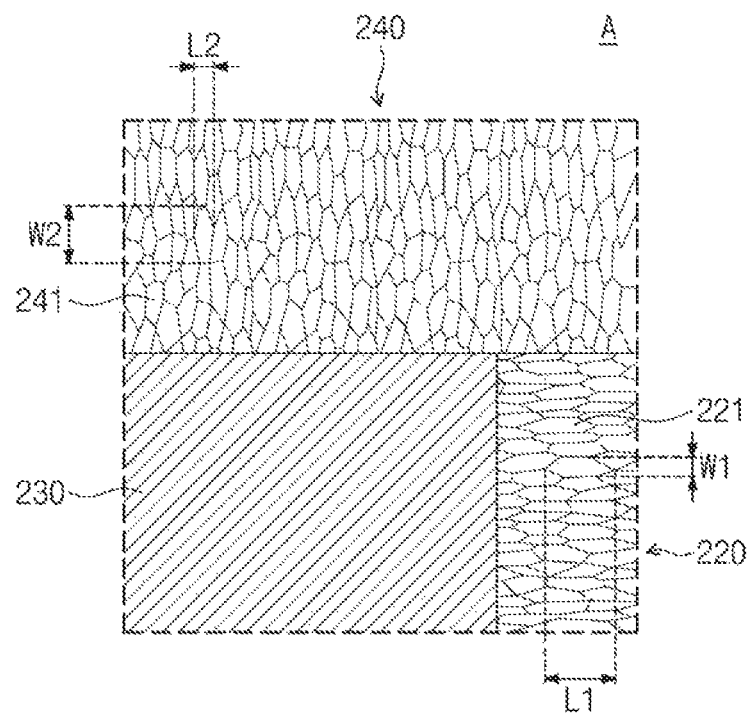
FIG. 2B is an enlarged view showing section A of FIG. 2A.

FIG. 1 is a plan view showing a semiconductor memory device according to an exemplary embodiment of the present inventive concept. FIG. 2A is a cross-sectional view taken along lines I-I' and II-II' of FIG. 1, showing a semiconductor memory device according to an exemplary embodiment of the present inventive concept. FIG. 2B is an enlarged view showing section A of FIG. 2A.

Referring to FIGS. 1 and 2A, a substrate 100 may be provided therein with a device isolation layer 110 defining active regions ACT. The substrate 100 may include a semiconductor substrate. For example, the semiconductor substrate may be or include a silicon (Si) substrate, a germanium (Ge) substrate, or a silicon-germanium (SiGe) substrate. The semiconductor substrate may also include other semiconducting materials such as, for example, III-V semiconductors which include at least one of group III elements, and at least one of group V elements. In addition, the substrate 100 may include one or more semiconductor layers or structures and may include active or operable portions of semiconductor devices. The active regions ACT may have a bar shape of which major axis is aligned in a third direction D3 intersecting first and second directions D1 and D2, in which the first and second directions D1 and D2 are perpendicular to each other.

The substrate 100 may be provided therein with a plurality of gate lines GL crossing the active regions ACT and the device isolation layer 110 when viewed in plan. The gate lines GL may be word lines. The gate lines GL may extend in the second direction D2, and may be spaced apart from each other in the first direction D1. The gate lines GL may be buried in the substrate 100. For example, the gate lines GL may be provided in trenches 120 of the substrate 100, and may extend crossing the active regions ACT and the device isolation layer 110. The gate lines GL are described in detail below.

Each of the gate lines GL may include a conductive layer 230, a liner layer 220, and a first work function adjusting layer 240.

The liner layer 220 may conformally cover a lower portion of the trench 120. For example, the liner layer 220 may cover a floor surface of the trench 120 and partially cover a sidewall of the trench 120, and may have a U-shaped cross-section. For example, the liner layer 220 may cover the floor surface and the lower portion of the inner sidewall of the trench 120. The liner layer 220 may have grains of which major axes are directed toward a direction perpendicular to an inner sidewall of the trench 120, or parallel to a top surface of the substrate 100. For example, as illustrated in FIG. 2B, grains 221 of the liner layer 220 may have a width W1 in a direction perpendicular to the top surface of the substrate 100 and a length L1, which is greater than the width W1, in a direction parallel to the top surface of the substrate 100. In addition, the liner layer 220 may have a first crystal plane parallel to the top surface of the substrate 100, and the first crystal plane may be a slip plane. The liner layer 220 may include a metallic material or a nitride thereof. For example, the metallic material may include titanium (Ti) or tungsten (W). The metal nitride may include, for example, titanium nitride (TiN) or tungsten nitride (WN). Differently from that shown, in an exemplary embodiment of the present inventive concept, the liner layer 220 may expose the floor surface of the trench 120. Hereinafter, an embodiment in which the liner layer 220 covers the floor surface of the trench 120 will be explained.

The conductive layer 230 may be provided in the lower portion of the trench 120, and may be disposed on the liner layer 220. On the liner layer 220, the conductive layer 230 may partially gap-fill the trench 120. For example, the conductive layer 230 may fill an inside of the liner layer 220, and may have a top surface at a level the same as that of a top surface of the liner layer 220. The liner layer 220 may separate the conductive layer 230 from the substrate 100. The conductive layer 230 may have a resistance less than that of the liner layer 220, and may include one of, for example, doped semiconductors (doped silicon (Si), doped germanium (Ge), etc.), conductive metal nitrides (titanium nitride (TiN), tantalum nitride (TaN), etc.), metals (tungsten (W), titanium (Ti), tantalum (Ta), etc.), and metal-semiconductor compounds (tungsten silicide ($WSi_2$), cobalt silicide ($CoSi_2$), titanium silicide ($TiSi_2$), etc.).

The first work function adjusting layer 240 may lie on the liner layer 220 and the conductive layer 230, and may partially fill the trench 120. The first work function adjusting layer 240 may cover an uppermost top surface of the liner layer 220 and an uppermost top surface of the conductive layer 230, and may have a top surface at a level lower than that of the top surface of the substrate 100. The first work function adjusting layer 240 may have grains of which major axes are directed toward a direction parallel to the inner sidewall of the trench 120, or perpendicular to the top surface of the substrate 100. Thus, the major axes of grains in the first work function adjusting layer 240 may be directed toward a direction perpendicular to that of the major axes of grains in the liner layer 220. For example, as illustrated in FIG. 2B, grains 241 of the first work function adjusting layer 240 may have a length L2 in a direction parallel to the top surface of the substrate 100 and a width W2, which is greater than the length L2, in a direction perpendicular to the top surface of the substrate 100. In addition, the first work function adjusting layer 240 may have a second crystal plane parallel to the inner sidewall of the trench 120, and the second crystal plane may be a slip plane. The first work function adjusting layer 240 may include metal or metal nitride in which a first work function adjusting element is implanted. For example, the first work function adjusting layer 240 may include a material (e.g., titanium (Ti), tungsten (W), or any nitride thereof) the same as that of the liner layer 220. In addition, a first work function adjusting material may be implanted in the first work function adjusting layer 240. The liner layer 220 may not include the first work function adjusting material. That is, the first work function adjusting material may not be implanted in the liner layer 220. However, the present inventive concept is not limited thereto. For example, in an exemplary embodiment of the present inventive concept, the first work function adjusting material may be implanted in an upper portion of the liner layer 220.

In this description, the work function adjusting material may be defined to refer to a material capable of changing a work function of metal or metal nitride. For example, the first work function adjusting material may include metal such as, for example, lanthanum (La), strontium (Sr), antimony (Sb), yttrium (Y), aluminum (Al), tantalum (Ta), hafnium (Hf), iridium (Ir), zirconium (Zr), or magnesium (Ma), or metal compound such as, for example, metal oxide or metal nitride. However, the present inventive concept is not limited thereto. For example, the first work function adjusting material may include metal alloy or metal carbide such as, for example, titanium aluminide (TiAl) or tantalum carbide (TaC). For example, the first work function adjusting layer 240 may include titanium nitride (TiN) in which lanthanum (La) is implanted. Thus, the metallic material (e.g., La) of the first work function adjusting material may be different from the metallic material (e.g., Ti) of the metal nitride (e.g., TiN) in the first work function adjusting layer 240. The first work function adjusting layer 240 in which the first work function adjusting material is implanted may have a work function less than that of the first work function adjusting layer 240 not doped with the first work function adjusting material. The first work function adjusting layer 240 may be formed to have a height h1 that is different depending on a work function required for the first work function adjusting layer 240. A work function of the first work function adjusting layer 240 may be less than those of the liner layer 220 and the conductive layer 230.

In an exemplary embodiment of the present inventive concept, a second work function adjusting material may further be implanted in the first work function adjusting layer 240. The second work function adjusting material may include an N+ charge. When being implanted with the second work function adjusting material, the first work function adjusting layer 240 may have a reduced work function.

Gate dielectric layers 210 may interpose between the gate lines GL and the active regions ACT, and may further interpose between the gate lines GL and the device isolation layer 110. The gate dielectric layer 210 may include, for example, oxide, nitride, and/or oxynitride. In addition, the gate dielectric layer 210 may include a high-dielectric constant material having a dielectric constant larger than silicon oxide. For example, the high-dielectric constant material may include, for example, aluminum oxide ($Al_2O_3$), lanthanum oxide ($La_2O_3$) or hafnium oxide ($HfO_2$). In an exemplary embodiment of the present inventive concept, the gate dielectric layer 210 may include the first work function adjusting material implanted in its portion adjacent to the first work function adjusting layer 240.

In an exemplary embodiment of the present inventive concept, the gate dielectric layer 210 may include the second work function adjusting material implanted in its portion adjacent to the first work function adjusting layer 240. For the gate dielectric layer 210, the portion in which the second work function adjusting material is implanted may have a work function less than that of other portion in which the second work function adjusting material is not implanted. For example, the work function of the upper portion of the gate dielectric layer 210 adjacent to the first work function adjusting layer 240 is lower than the work function of the lower portion of the gate dielectric layer 210.

First capping layers 250 may lie on the gate lines GL. The first capping layers 250 may have top surfaces at a level the same as that of the top surface of the substrate 100, and may include, for example, a silicon oxide ($SiO_2$) layer, a silicon nitride ($Si_3N_4$) layer, and/or a silicon oxynitride (SiON) layer. Each of the first capping layers 250 may have opposite side surfaces in contact with the active regions ACT and/or the device isolation layer 110. The gate dielectric layers 210 interposed between the first capping layers 250 and the active regions ACT may serve as buffers that reduce stresses between the first capping layers 250 and the active regions ACT. Alternatively, the gate dielectric layers 210 may not extend between the active regions ACT and the first capping layers 250 or between the device isolation layer 110 and the first capping layers 250. For example, the gate dielectric layers 210 may have uppermost top ends in contact with bottom surfaces of the first capping layers 250.

Doping regions, which include a first doping region SD1 and a second doping region SD2, may be disposed in the active regions ACT adjacent to opposite side surfaces of each of the gate lines GL. For example, the first doping region SD1 may be disposed between the gate lines GL, and the second doping region SD2 may be disposed between the gate line GL and the device isolation layer 110. The first and second doping regions SD1 and SD2 may extend into an inside of the substrate 100 from the top surface of the substrate 100, and may have conductive types different from that of the substrate 100. For example, when the substrate 100 has a P-type conductivity, the first and second doping regions SD1 and SD2 may have an N-type conductivity. When the substrate 100 is a P-doped silicon substrate, the Si substrate may be doped with P-type dopants such as, for example, boron (B), aluminum (Al), gallium (Ga) and indium (In). When the substrate 100 is an N-doped silicon substrate, the Si substrate may be doped with N-type dopants such as, for example, antimony (Sb), arsenic (As) and phosphorous (P). The first and second doping regions SD1 and SD2 may each correspond to a source region or a drain region.

The substrate 100 may be provided thereon with a first pad 310 connected to the first doping region SD1 and with a second pad 320 connected to the second doping region SD2. The first and second pads 310 and 320 may include a conductive material such as, for example, doped polysilicon or metal.

A first interlayer dielectric layer 400 may be disposed on the first and second pads 310 and 320. The first interlayer dielectric layer 400 may include, for example, a silicon oxide ($SiO_2$) layer, a silicon nitride ($Si_3N_4$) layer, or a silicon oxynitride (SiON) layer.

Bit lines BL may lie on the first interlayer dielectric layer 400, and may be provided in a second interlayer dielectric layer 540 on the first interlayer dielectric layer 400. The second interlayer dielectric layer 540 may include, for example, a silicon oxide ($SiO_2$) layer, a silicon nitride ($Si_3N_4$) layer, or a silicon oxynitride (SiON) layer. The bit line BL may be connected to the first pad 310 through a first contact 510 penetrating the first interlayer dielectric layer 400. Thus, the bit line BL may be disposed on the substrate 100 and connected to the first doping region SD1 through the first contact 510 and the first pad 310. The bit lines BL and the first contact 510 may include a conductive material such as, for example, doped silicon or metal.

Second capping layers 520 may be disposed on the bit lines BL, and insulating spacers 530 may cover sidewalls of the bit lines BL. The second capping layers 520 and the insulating spacers 530 may include one of, for example, a silicon nitride ($Si_3N_4$) layer, a silicon oxide ($SiO_2$) layer, and a silicon oxynitride (SiON) layer.

The substrate 100 may be provided thereon with a second contact 610 that penetrates the first and second interlayer dielectric layers 400 and 540 and is connected to the second pad 320. The second contact 610 may include a conductive material such as, for example, doped silicon or metal.

The second interlayer dielectric layer 540 may be provided thereon with a data storage element connected to the second contact 610. For example, the data storage element may be a capacitor CA including a first electrode 620, a second electrode 640, and a dielectric layer 630 interposed between the first and second electrodes 620 and 640. Thus, the capacitor CA may be disposed on the substrate 100 and connected to the second doping region SD2 through the second contact 610 and the second pad 320. The first electrode 620 may have a cylindrical shape of which bottom is closed. The second electrode 640 may be a common electrode covering the first electrode 620. The first and second electrodes 620 and 640 may include, for example, doped silicon, metal, or metal compound.

A support layer 700 may be provided between the second electrode 640 and the second interlayer dielectric layer 540. The support layer 700 may be located on an outer sidewall of the first electrode 620 to prevent the collapse of the first electrode 620, and may include an insulating material.

In a semiconductor memory device according to an exemplary embodiment of the present inventive concept, each of the gate lines GL may include at its upper portion the first work function adjusting layer 240 having a low work function. The first work function adjusting layer 240 may reduce a gate induced drain leakage current (GIDL) that flows from the gate line GL into the first and second doping regions SD1 and SD2.

The work function of the first work function adjusting layer 240 may be controlled by a volume of the first work function adjusting layer 240 and/or by an amount of the first work function adjusting material doped into the first work function adjusting layer 240. Accordingly, the height h1 of the first work function adjusting layer 240 may have an effect on controlling the work function of the first work function adjusting layer 240, and by varying the height h1, it may be easy to design a shape of the first work function adjusting layer 240 in accordance with a work function required for the first work function adjusting layer 240.

In a semiconductor memory device according to an exemplary embodiment of the present inventive concept, the first work function adjusting layer 240 of the gate line GL may have a low work function to reduce a gate induced drain leakage current, but a threshold voltage may be maintained high because a work function is not reduced at a channel region below the gate line GL. For example, the work function of the first work function adjusting layer 240 at the upper portion of the gate line GL may be less than the work functions of the liner layer 220 and the conductive layer 230 at the lower portion of the gate line GL, and the work functions of the liner layer 220 and the conductive layer 230 may be maintained high. As the work function of the gate line GL increases, the corresponding threshold voltage increases. Since the work functions of the liner layer 220 and the conductive layer 230 may not be reduced and maintained high, the threshold voltage may also be maintained high.

Figure 3:
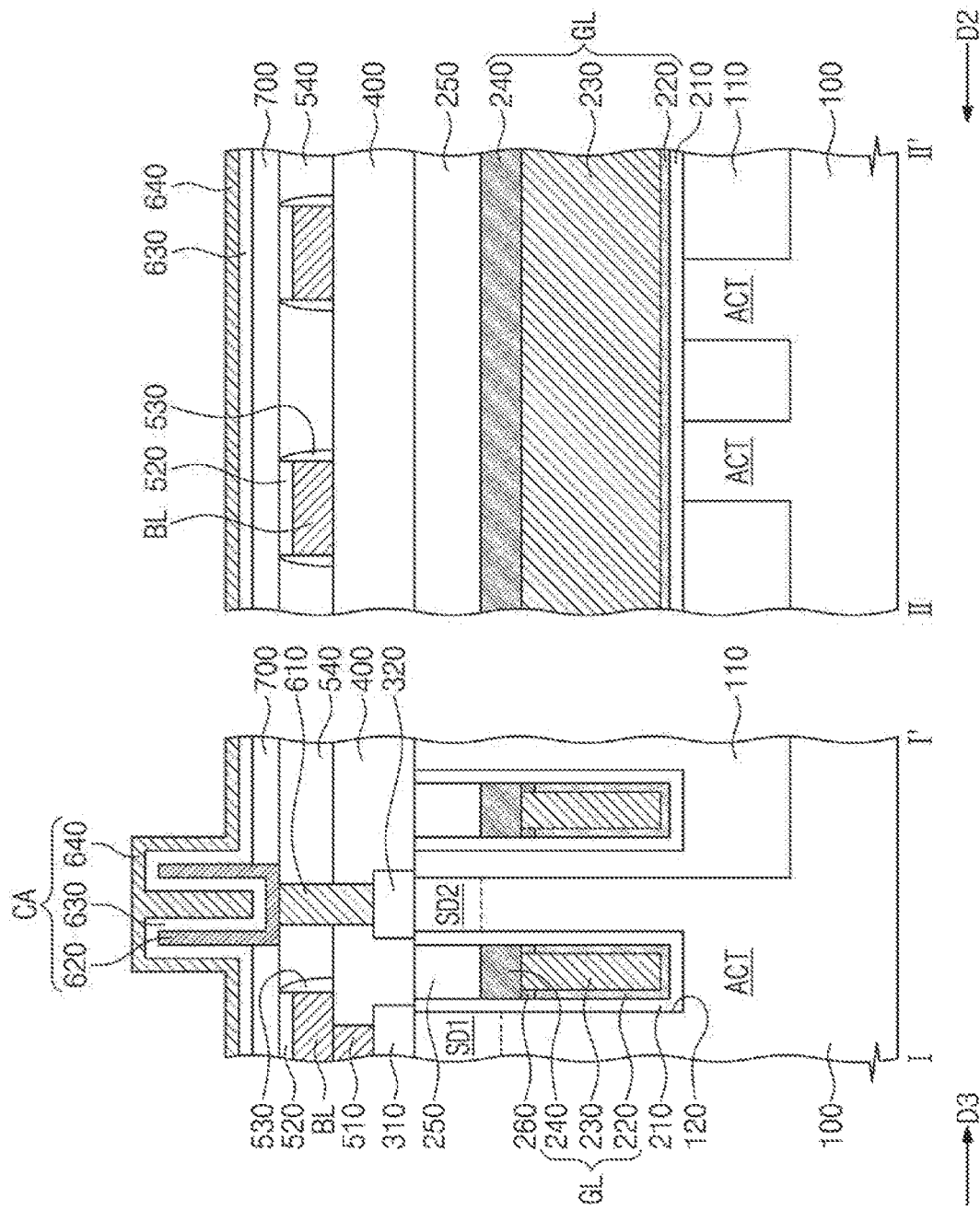
FIGS. 3 and 4 are cross-sectional views showing a semiconductor memory device according to an exemplary embodiment of the present inventive concept.
Figure 4:
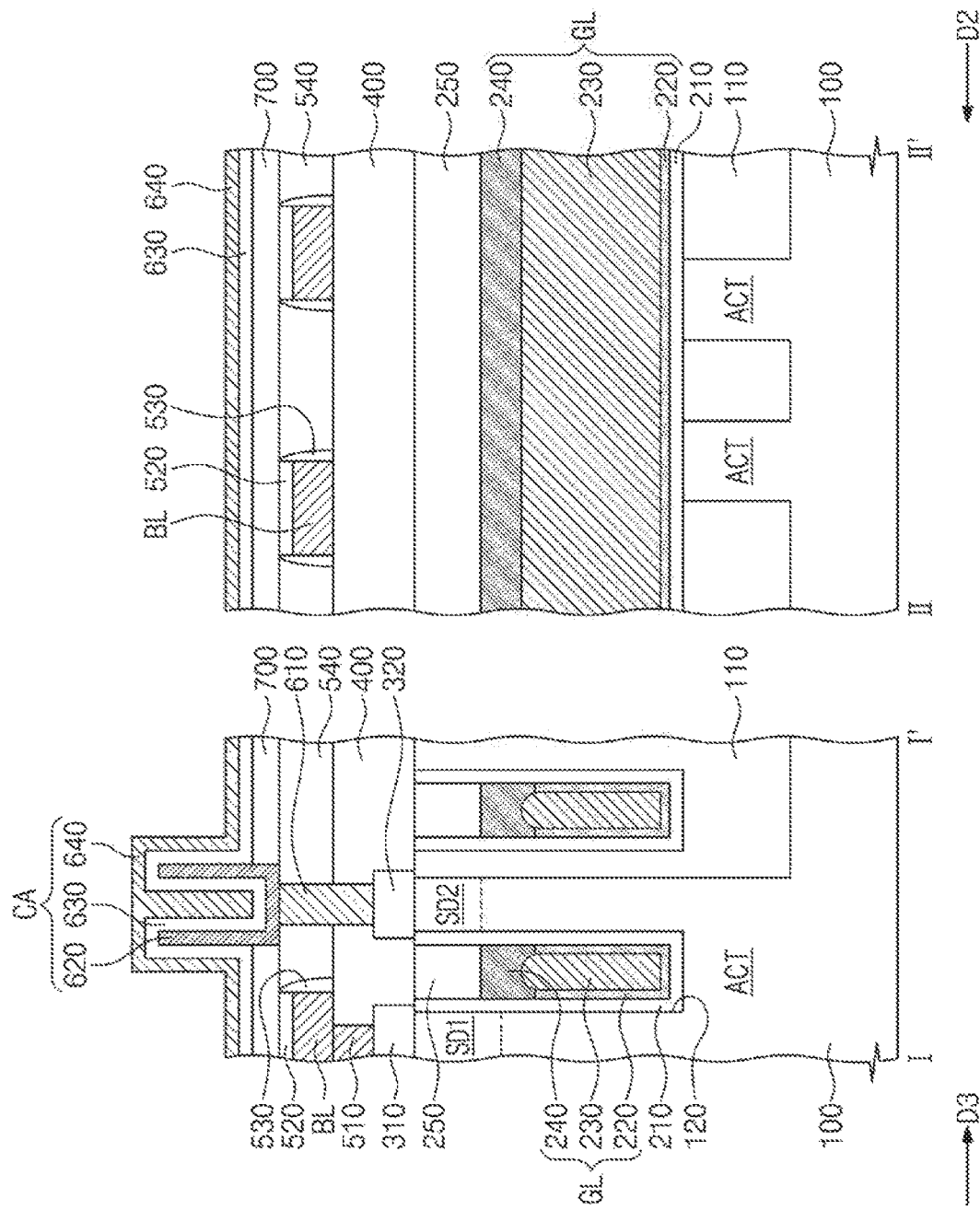

In an exemplary embodiment of the present inventive concept, the top surface of the conductive layer 230 may be at a level higher than that of the top surface of the liner layer 220. FIGS. 3 and 4 are cross-sectional views taken along lines I-I' and II-II' of FIG. 1, each showing a semiconductor memory device according to an exemplary embodiment of the present inventive concept.

Referring to FIG. 3, the top surface of the conductive layer 230 may be higher than the top surface of the liner layer 220. For example, the conductive layer 230 may have a shape protruding above the top surface of the liner layer 220. The top surface of the conductive layer 230 may be flat. A second work function adjusting layer 260 may be provided between the first work function adjusting layer 240 and the liner layer 220. The second work function adjusting layer 260 may be disposed on a side of the conductive layer 230, and may include a material the same as those of the liner layer 220 and the first work function adjusting layer 240. The second work function adjusting layer 260 may have grains of which major axes are directed toward a direction perpendicular to the inner sidewall of the trench 120, or parallel to the top surface of the substrate 100. For example, the major axes of grains in the second work function adjusting layer 260 may be directed toward a direction parallel to that of the major axes of grains in the liner layer 220. For example, the grains of the second work function adjusting layer 260 may have a width in a direction perpendicular to the top surface of the substrate 100 and a length, which is greater than the width, in a direction parallel to the top surface of the substrate 100. In addition, the second work function adjusting layer 260 may have a third crystal plane parallel to the top surface of the substrate 100, and the third crystal plane may be a slip plane. However, the present inventive concept is not limited thereto. For example, in an exemplary embodiment of the present inventive concept, the second work function adjusting layer 260 may have grains of which major axes are directed toward a direction parallel to the inner sidewall of the trench 120, or perpendicular to the top surface of the substrate 100. For example, the major axes of grains in the second work function adjusting layer 260 may be formed to be directed toward a direction perpendicular to that of the major axes of grains in the liner layer 220.

The second work function adjusting layer 260 may include metal or metal nitride, and may include a material (e.g., titanium (Ti), tungsten (W), or any nitride thereof) the same as that of the liner layer 220. In addition, the first work function adjusting material may be implanted in the second work function adjusting layer 260. For example, the second work function adjusting layer 260 may include titanium nitride (TiN) in which lanthanum (La) is implanted. The second work function adjusting layer 260 in which the first work function adjusting material is implanted may have a work function less than that of the second work function adjusting layer 260 not doped with the first work function adjusting material. A work function of the second work function adjusting layer 260 may be less than those of the liner layer 220 and the conductive layer 230.

In an exemplary embodiment of the present inventive concept, the conductive layer 230 may be provided on its side with the second work function adjusting layer 260 having a low work function. Accordingly, it may be possible to effectively reduce a gate induced drain leakage current (GIDL) that flows from the gate lines GL into the first and second doping regions SD1 and SD2.

In a semiconductor memory device according to an exemplary embodiment of the present inventive concept, the first work function adjusting layer 240 and the second work function adjusting layer 260 of the gate line GL may have low work functions to reduce a gate induced drain leakage current, but a threshold voltage may be maintained high because a work function or work functions of lower gate line GL portion is not reduced. For example, the work functions of the first and second work function adjusting layers 240 and 260 at the upper portion of the gate line GL may be less than those of the liner layer 220 and the conductive layer 230 at the lower portion of the gate line, and the work functions of the liner layer 220 and the conductive layer 230 may be maintained high. As the work function of the gate line GL increases, the corresponding threshold voltage increases. Since the work functions of the liner layer 220 and the conductive layer 230 may not be reduced and maintained high, the threshold voltage may also be maintained high.

The top surface of the conductive layer 230 may be curved. As illustrated in FIG. 4, the top surface of the conductive layer 230 may be a convexly curved surface facing upward. The first work function adjusting layer 240 may have a bottom surface in contact with (superimposed with, or covering) the top surfaces of the liner layer 220 and the conductive layer 230. For example, a portion of the first work function adjusting layer 240 may extend between the conductive layer 230 and the gate dielectric layer 210, and the bottom surface of the first work function adjusting layer 240 may have a concave shape extending inward the first work function adjusting layer 240. That is, the bottom surface of the first work function adjusting layer 240 may be concave downward.

As a portion of the first work function adjusting layer 240 encloses the protruding top surface of the conductive layer 230, the first work function adjusting layer 240 may serve as a barrier preventing a gate induced drain leakage current that flows from the gate line GL into the first and second doping regions SD1 and SD2. The liner layer 220 and the conductive layer 230 are at the lower portion of the gate line GL around the channel region. Since the work functions of the liner layer 220 and the conductive layer 230 may not be reduced and maintained high, the threshold voltage may also be maintained high.

FIGS. 5 to 11 are cross-sectional views taken along lines I-I' and II-II' of FIG. 1, showing a method of manufacturing a semiconductor memory device according to an exemplary embodiment of the present inventive concept.

Figure 5:
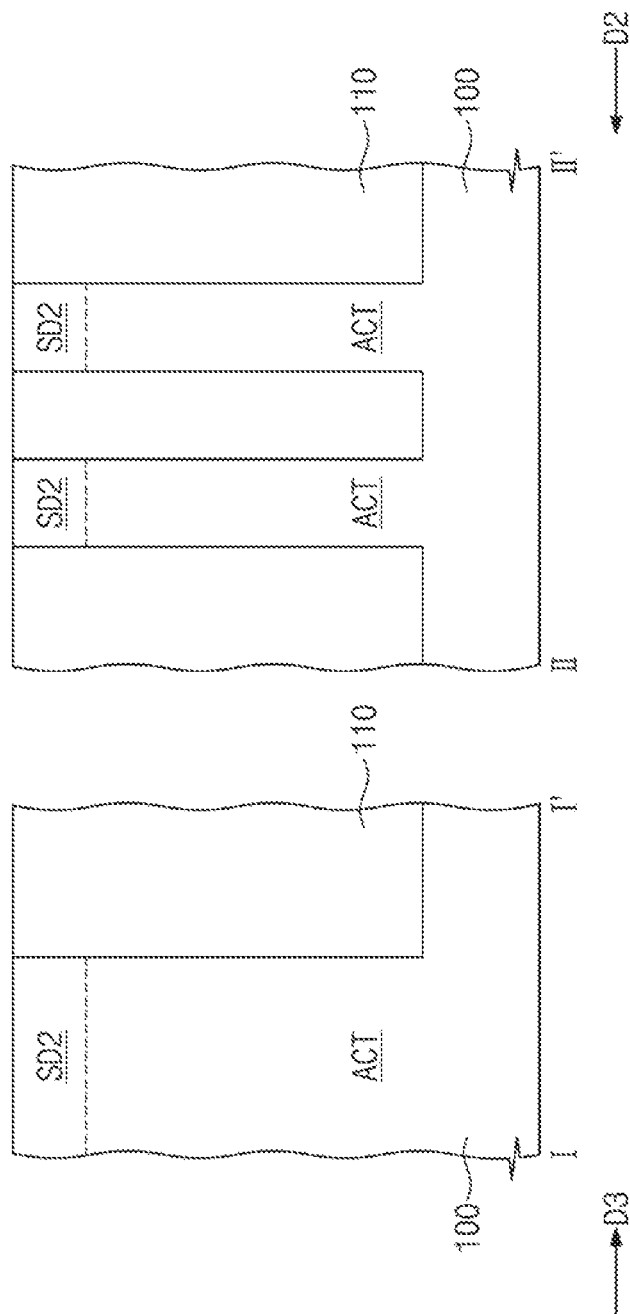
FIGS. 5 to 11 are cross-sectional views showing a method of manufacturing a semiconductor memory device according to an exemplary embodiment of the present inventive concept.

Referring to FIG. 5, a device isolation layer 110 may be formed in the substrate 100, thereby defining active regions ACT. The device isolation layer 110 may be formed by a shallow trench isolation (STI) process. The device isolation layer 110 may include, for example, a silicon nitride ($Si_3N_4$) layer, a silicon oxide ($SiO_2$) layer, and/or a silicon oxynitride (SiON) layer, and may be formed to extend into the substrate 100.

Second doping regions SD2 may be formed in the active regions ACT of the substrate 100. An ion implantation process may be employed to form the second doping regions SD2. For example, the second doping region SD2 may be an area which is doped with an N-type dopant.

Figure 6:
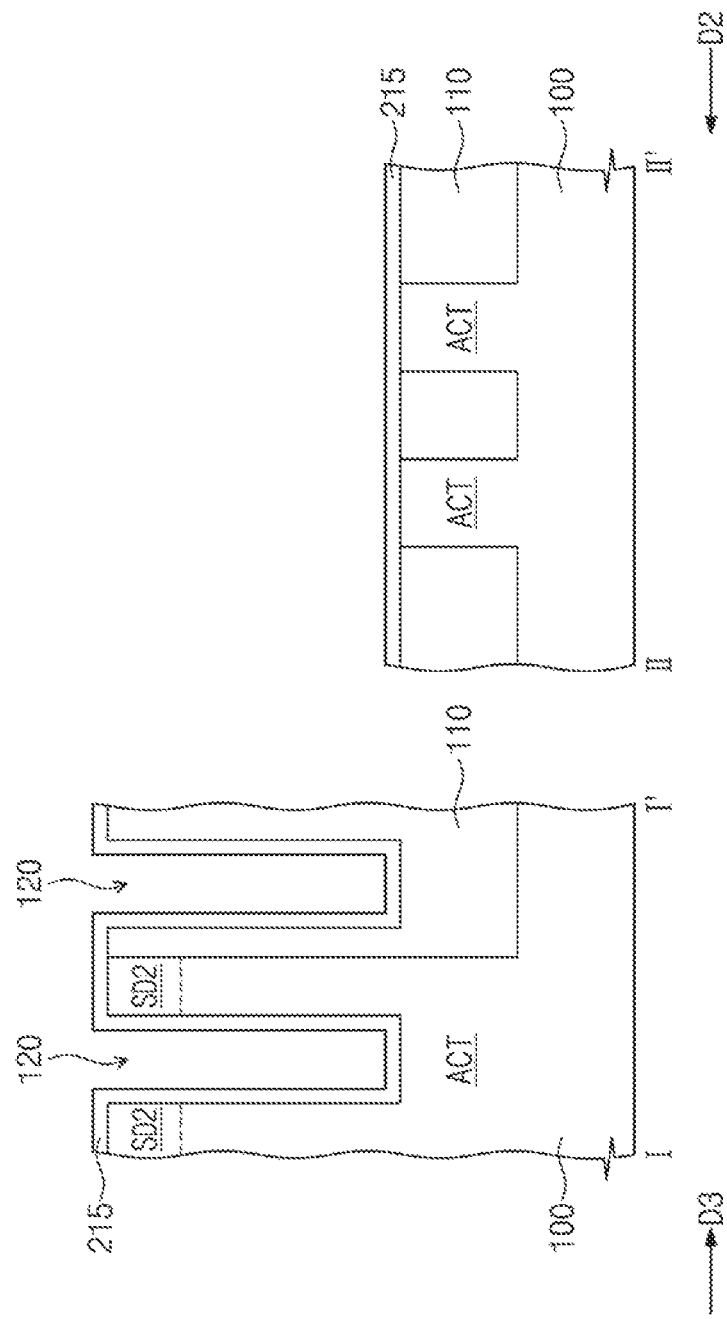

Referring to FIG. 6, a trench 120 may be formed in the substrate 100. For example, mask patterns may be formed on the substrate 100, and then the substrate 100 and the device isolation layer 110 may be etched using an etching process in which the mask patterns serve as an etching mask, thereby forming the trench 120 shaped like a line extending in a second direction D2. The trench 120 may have a floor surface exposing the device isolation layer 110 and the active region ACT. The mask patterns may be removed after the etching process is performed.

An insulating layer 215 may be formed on the substrate 100 including the trench 120 formed therein. The insulating layer 215 may be formed by, for example, a thermal oxidation process, an atomic layer deposition (ALD) process, a chemical vapor deposition (CVD) process, or the like. The insulating layer 215 may cover a top surface of the substrate 100 and inner sidewall and floor surfaces of the trench 120. The insulating layer 215 may include a silicon oxide layer, but the present inventive concept is not limited thereto. For example, in an exemplary embodiment of the present inventive concept, the insulating layer 215 may include, for example, one of silicon nitride (SiN), silicon oxynitride (SiON) and a high-dielectric constant material having a dielectric constant greater than silicon oxide. For example, the high-dielectric constant material may include, for example, aluminum oxide ($Al_2O_3$), lanthanum oxide ($La_2O_3$) or hafnium oxide ($HfO_2$).

Gate lines GL may be formed in the trench 120. Each of the gate lines GL may include a conductive layer 230, a liner layer 220, and a first work function adjusting layer 240. The formation of the gate lines GL with reference to FIGS. 7 to 10 will be hereinafter described in detail.

Figure 7:
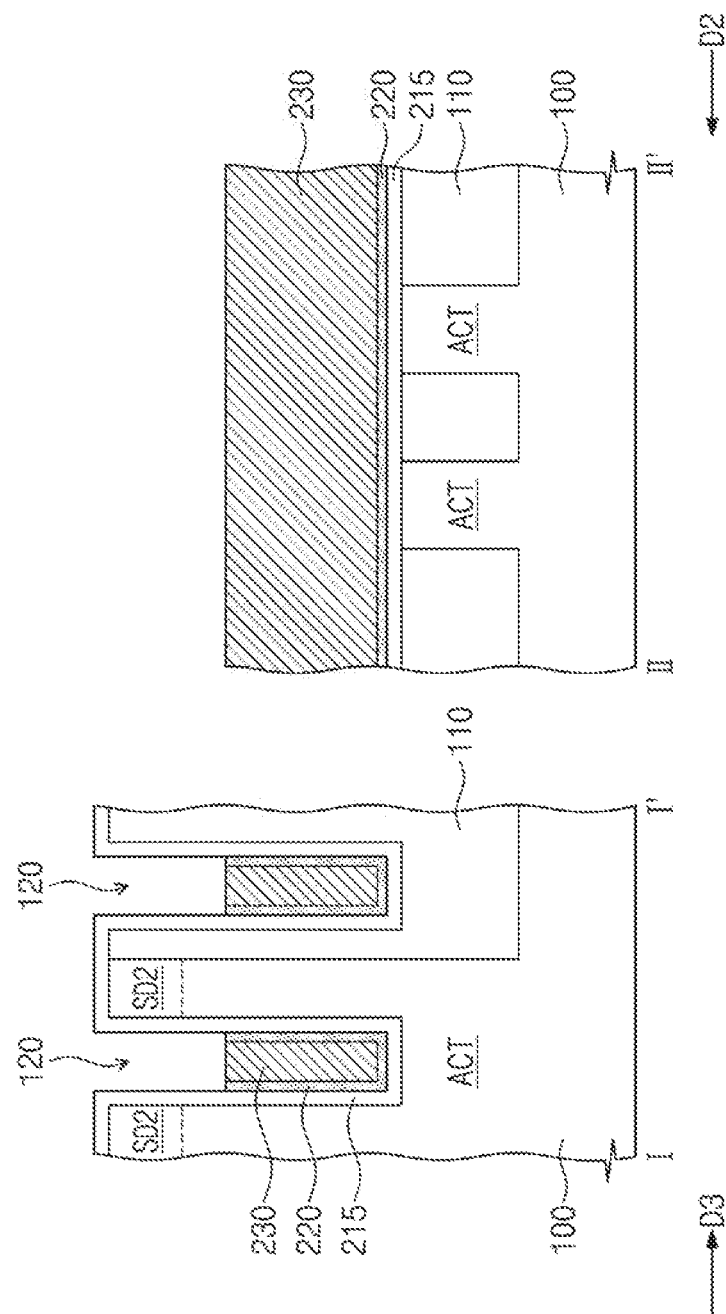

Referring to FIG. 7, the liner layer 220 and the conductive layer 230 may be formed in a lower portion of the trench 120 including the insulating layer 215 formed thereon. For example, a preliminary liner layer may be formed on the substrate 100. The preliminary liner layer may be formed by a chemical vapor deposition (CVD) process or the like, and may be formed to conformally cover the insulating layer 215. When the preliminary liner layer is deposited, the preliminary liner layer may grow from an inner sidewall of the trench 120 toward an inside of the trench 120. As the preliminary liner layer grows in a direction perpendicular to the inner sidewall of the trench 120, the preliminary liner layer may be formed in such a way that its grains are directed toward a growth direction of the preliminary liner layer, or toward a direction perpendicular to the inner sidewall of the trench 120. Thus, the preliminary liner layer may have grains with their major axes directed toward a direction perpendicular to the inner sidewall of the trench 120. In addition, a portion of the preliminary liner layer may grow to have a slip plane parallel to the growth direction of the preliminary liner layer. The preliminary liner layer may include metal or metal nitride, and may include, for example, titanium (Ti), tungsten (W), or any nitride thereof.

A conductive material may be deposited on an entire surface of the substrate 100 including the preliminary liner layer formed thereon. The conductive material may fill the trench 120. The conductive material may be deposited by, for example, a chemical vapor deposition (CVD) process or the like, and may include one of, for example, doped semiconductors (doped silicon (Si), doped germanium (Ge), etc.), conductive metal nitrides (titanium nitride (TiN), tantalum nitride (TaN), etc.), metals (tungsten (W), titanium (Ti), tantalum (Ta), etc.), and metal-semiconductor compounds (tungsten silicide ($WSi_2$), cobalt silicide ($CoSi_2$), titanium silicide ($TiSi_2$), etc.). Thereafter, an etching process may be performed to etch the deposited preliminary liner layer and conductive material to form the liner layer 220 and the conductive layer 230. The liner layer 220 may have grains of which major axes are directed toward a direction perpendicular to the inner sidewall of the trench 120. In addition, the liner layer 220 may have a first crystal plane, or a slip plane parallel to the top surface of the substrate 100. The etching process may be performed until the liner layer 220 and the conductive layer 230 are formed to have required thicknesses in the lower portion of the trench 120. The liner layer 220 may separate the conductive layer 230 from the substrate 100 and/or the insulating layer 215.

In an exemplary embodiment of the present inventive concept, after the etching process, a surface treatment process may further be performed on the insulating layer 215. For example, a second work function adjusting material may be doped into an exposed surface of the insulating layer 215. The second work function adjusting material may be formed by, for example, a plasma nitridation (PN) process, a rapid thermal nitridation (RTN) process, or the like, and may include an N+ charge.

Figure 8:
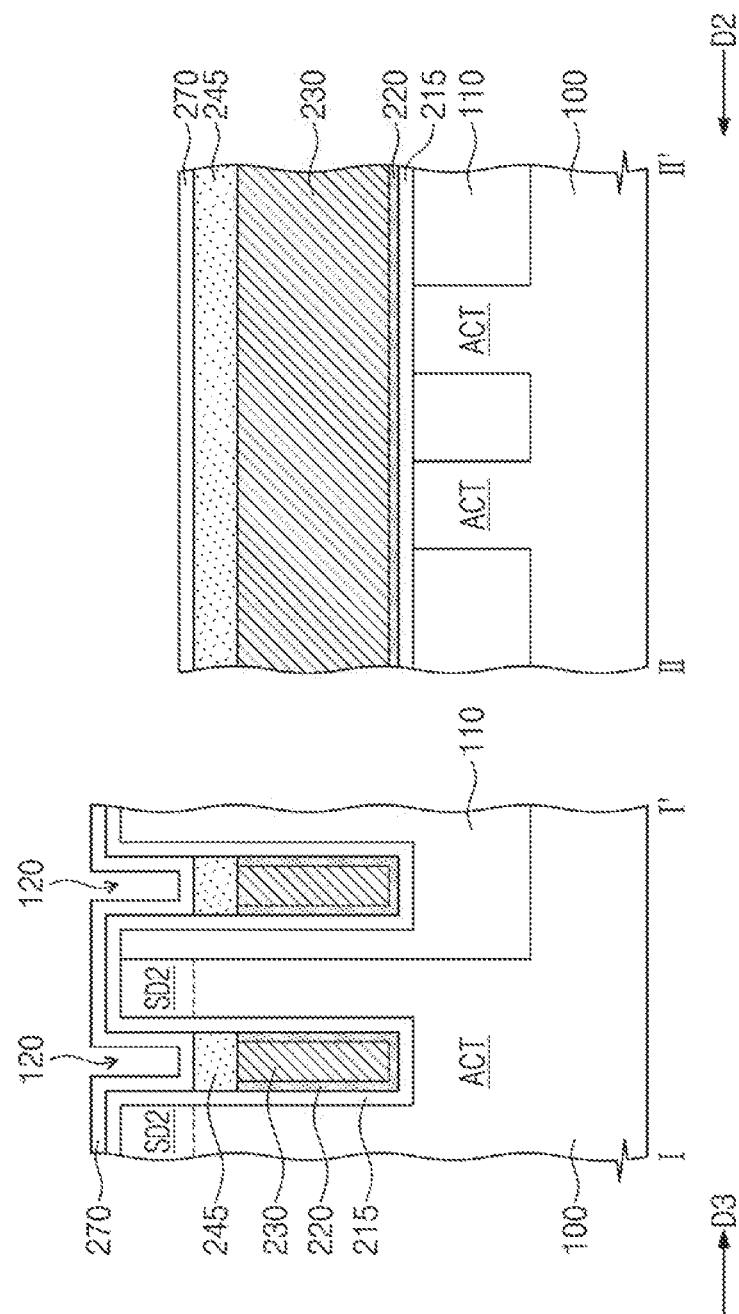

Referring to FIG. 8, a preliminary first work function adjusting layer 245 may be formed on the liner layer 220 and the conductive layer 230. The preliminary first work function adjusting layer 245 may be formed by, for example, a physical vapor deposition (PVD) process or the like, and may fill a remainder of the trench 120. When the preliminary first work function adjusting layer 245 is deposited, the preliminary first work function adjusting layer 245 may grow in an upward direction from top surfaces of the liner layer 220 and the conductive layer 230. As the preliminary first work function adjusting layer 245 grows in a direction parallel to the inner sidewall of the trench 120, the preliminary first work function adjusting layer 245 may be formed in such a way that its grains are directed toward a growth direction of the preliminary first work function adjusting layer 245, or toward a direction perpendicular to the top surface of the substrate 100. In addition, the preliminary first work function adjusting layer 245 may grow to have a slip plane parallel to the growth direction of the preliminary first work function adjusting layer 245. The preliminary first work function adjusting layer 245 may include, for example, a metallic material or a nitride thereof, and may include metal such as, for example, titanium (Ti) or tungsten (W). After that, an etching process may be performed to etch the preliminary first work function adjusting layer 245. The etching process may continue until the preliminary first work function adjusting layer 245 is etched to have a desired thickness in the trench 120. The preliminary first work function adjusting layer 245 may be formed to have a thickness that varies depending on a work function required for a first work function adjusting layer 240 which will be described below with reference to FIG. 9.

In an exemplary embodiment of the present inventive concept, after the etching process, a surface treatment process may further be performed on the preliminary first work function adjusting layer 245. For example, a second work function adjusting material may be doped into a top surface of the preliminary first work function adjusting layer 245. The second work function adjusting material may be formed by, for example, a rapid thermal nitridation (RTN) process or the like, and may include an N+ charge.

A source material layer 270 may be formed on the substrate 100. The source material layer 270 may be formed to conformally cover the insulating layer 215 and the top surface of the preliminary first work function adjusting layer 245. The source material layer 270 may be formed by, for example, a chemical vapor deposition (CVD) process or the like, and may include a work function adjusting material or a compound thereof. For example, the source material layer 270 may include a material (e.g., lanthanum (La), strontium (Sr), antimony (Sb), yttrium (Y), aluminum (Al), tantalum (Ta), hafnium (Hf), iridium (Ir), zirconium (Zr), or magnesium (Ma), or a compound thereof) the same as that of the first work function adjusting material.

Figure 9:
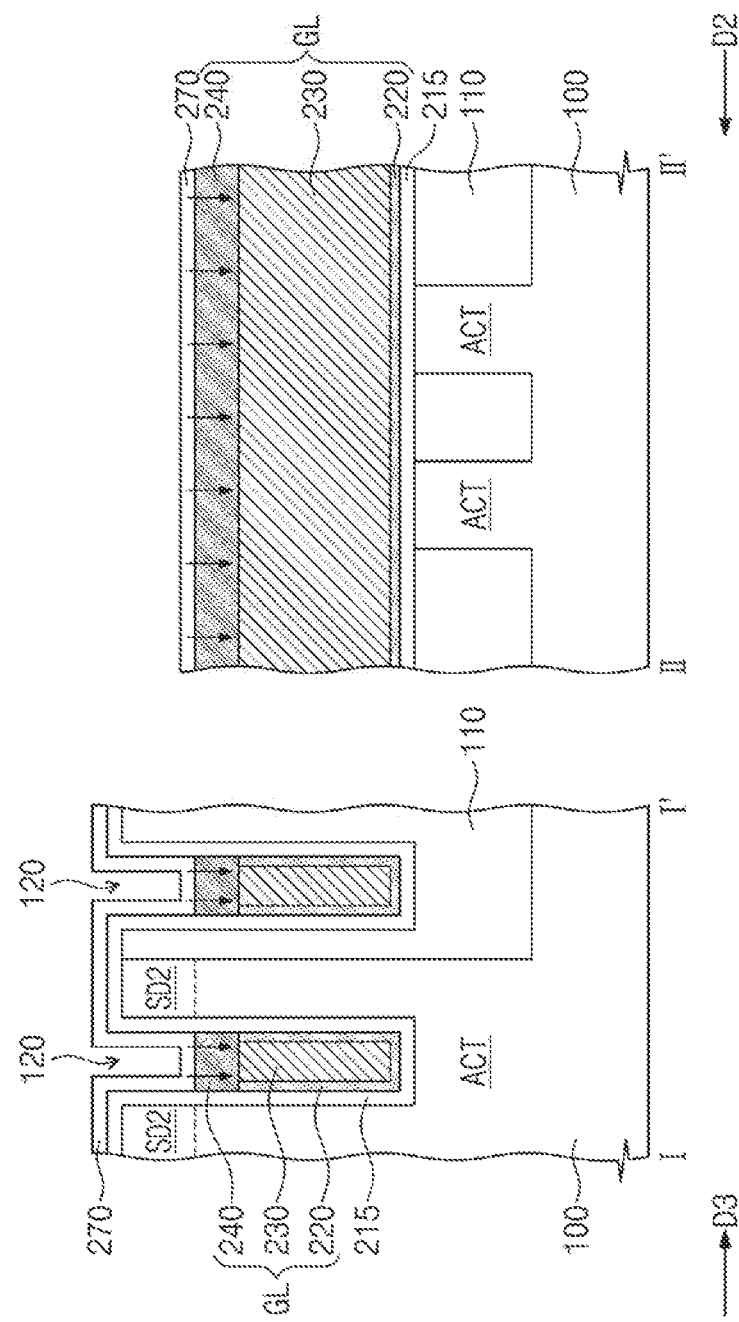
Figure 10:
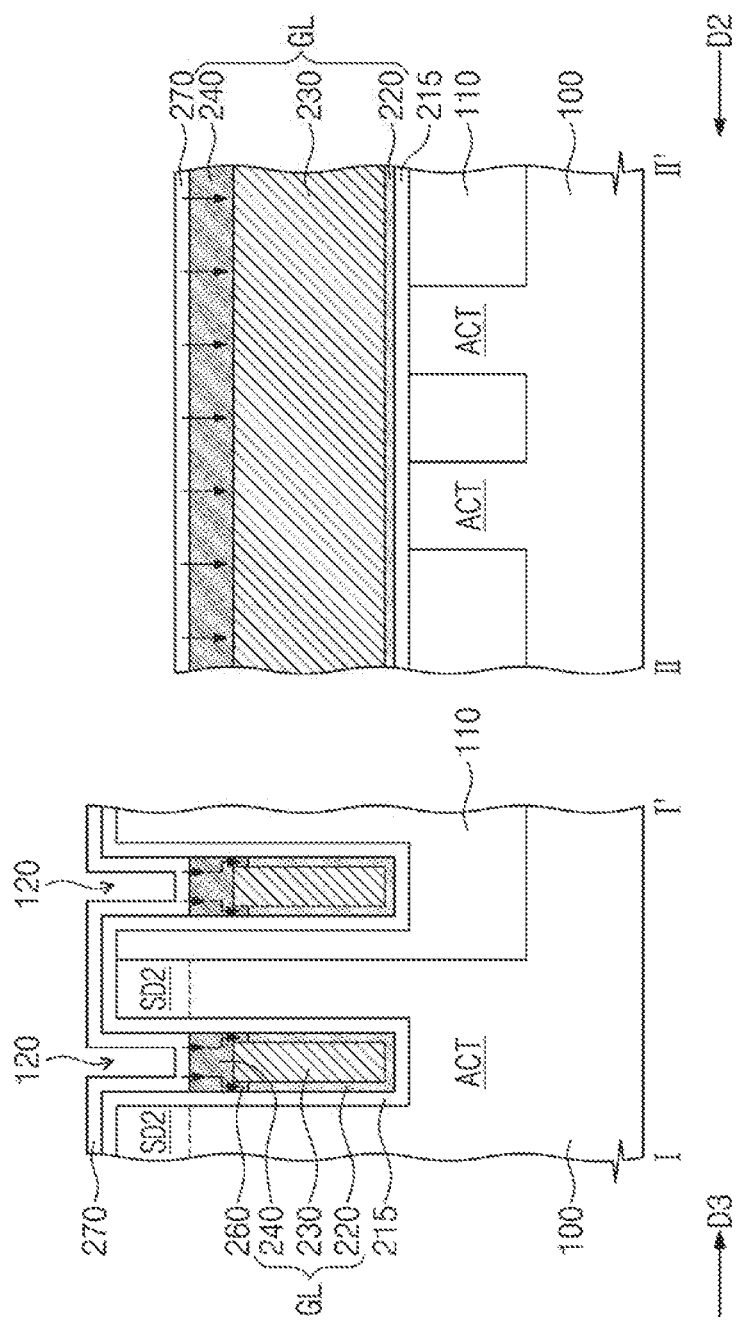

Referring to FIG. 9, the first work function adjusting material may diffuse into the preliminary first work function adjusting layer 245. For example, as indicated by arrows in FIG. 9, the first work function adjusting material may diffuse from the source material layer 270 into the preliminary first work function adjusting layer 245. The preliminary first work function adjusting layer 245 may be entirely doped with the first work function adjusting material. Accordingly, the preliminary first work function adjusting layer 245 may decrease in effective work function, and thus a first work function adjusting layer 240 may be formed. Alternatively, some portion but not all of the preliminary first work function adjusting layer 245 may be doped with the first work function adjusting material. For example, a top end portion of the preliminary first work function adjusting layer 245 may be doped with the first work function adjusting material. A diffusion amount of the first work function adjusting material may be controlled based on an effective work function required for the first work function adjusting layer 240. The first work function adjusting layer 240 may have an effective work function less than those of the liner layer 220 and the conductive layer 230. The diffusion of the first work function adjusting material may be accomplished through a heat treatment process (e.g., an annealing process). The first work function adjusting layer 240 may have grains of which major axes are directed toward a direction perpendicular to the top surface of the substrate 100, or perpendicular to a top surface of the first work function adjusting layer 240. In addition, the first work function adjusting layer 240 may have a second crystal plane, or a slip plan perpendicular to the top surface of the substrate 100. Accordingly, the first work function adjusting material may easily migrate into the first work function adjusting layer 240 through grain boundaries of the grains or through the second crystal plane. In an exemplary embodiment of the present inventive concept, the insulating layer 215 may have a portion which is adjacent to the first work function adjusting layer 240, and into which the first work function adjusting material diffuses.

In an exemplary embodiment of the present inventive concept, the diffusion of the first work function adjusting material may continue after the first work function adjusting layer 240 is doped with the first work function adjusting material. As indicated by arrows in FIG. 10, the first work function adjusting material may diffuse through the first work function adjusting layer 240 into a top end portion of the liner layer 220. A second work function adjusting layer 260 may be formed by the diffusion of the first work function adjusting material into the top end portion of the liner layer 220. Since the second work function adjusting layer 260 is formed at the top end portion of the liner layer 220, the second work function adjusting layer 260 may have a third crystal plane parallel to the top surface of the substrate 100, and the third crystal plane may be a slip plane. Here, the third crystal plane may be parallel to the second crystal plane of the liner layer 220. For convenience of description, an embodiment illustrated in FIG. 11 will be hereinafter explained.

Figure 11:
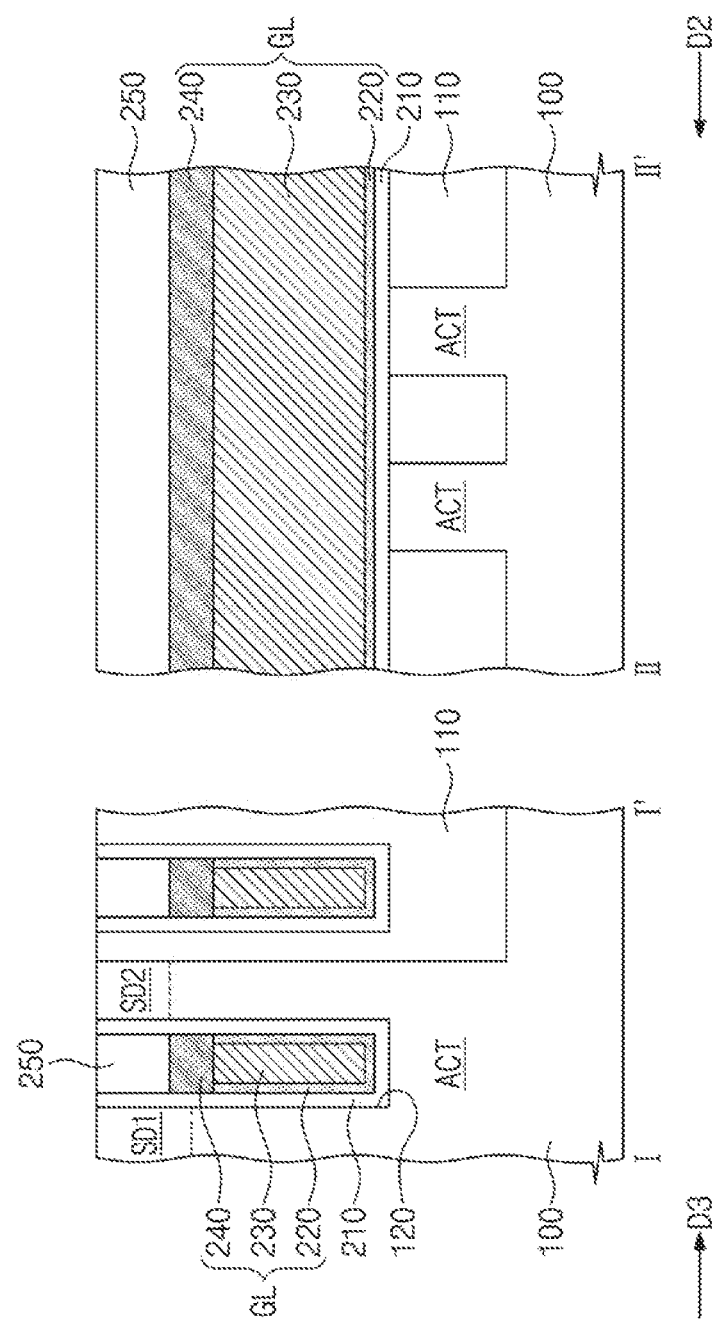

Referring to FIG. 11, the source material layer 270 may be removed. For example, a wet etching process may be performed to remove the source material layer 270. The removal of the source material layer 270 may reveal the insulating layer 215 and the top surface of the first work function adjusting layer 240.

After removing the source material layer 270, first capping layers 250 may be formed in the trench 120. For example, a capping layer may be formed on the entire surface of the substrate 100, and then a planarization process may be performed on the capping layer, thereby forming the first capping layers 250. The planarization process may be a chemical mechanical planarization (CMP) process or an etch back process. In this step, the planarization process may remove a portion of the insulating layer 215 from the top surface of the substrate 100. The partial removal of the insulating layer 215 may form gate dielectric layers 210 between the gate lines GL and the active regions ACT and/or between the gate lines GL and the device isolation layer 110. The first capping layers 250 may include one of, for example, a silicon nitride ($Si_3N_4$) layer, a silicon oxide ($SiO_2$) layer, and a silicon oxynitride (SiON) layer. The planarization process may reveal top surfaces of the active regions ACT and a top surface of the device isolation layer 110.

An ion implantation process may be performed on the substrate 100 to form a first doping region SD1 in the active region ACT between two neighboring gate lines GL. The first doping region SD1 may be doped with an N-type dopant the same as that of the second doping region SD2 may be doped with. The first doping region SD1 may extend deeper into the substrate 100 than the second doing region SD2.

Referring back to FIG. 2A, a conductive layer may be formed on the substrate 100, and then patterned to form a first pad 310 and a second pad 320. The first pad 310 may be connected to the first doping region SD1, and the second pad 320 may be connected to the second doping region SD2. The first and second pads 310 and 320 may include, for example, a doped polysilicon layer, a doped single crystalline silicon layer, or a metal layer.

A first interlayer dielectric layer 400 may be formed on the first and second pads 310 and 320. The first interlayer dielectric layer 400 may be formed by, for example, a chemical vapor deposition (CVD) process or the like. The first interlayer dielectric layer 400 may be partially patterned to form contact holes each defining an area where a first contact 510 is formed. The first interlayer dielectric layer 400 may be coated thereon with a conductive material filling the contact holes, and a capping layer may be formed on the conductive material. The capping layer and the conductive material may be patterned to form bit lines BL and second capping layers 520 on the bit lines BL. First contacts 510 may be formed in the contact holes. An insulating spacer layer may be conformally deposited on the first interlayer dielectric layer 400, and then anisotropically etched to form insulating spacers 530 covering sidewalls of the bit line BL. Thus, the bit line BL may be disposed on the substrate 100 and connected to the first doping region SD1 through the first contact 510 and the first pad 310.

A second interlayer dielectric layer 540 may be formed on the first interlayer dielectric layer 400, and then a planarization process may be performed to expose top surfaces of the second capping layers 520. The planarization process may be a chemical mechanical planarization (CMP) process or an etch back process. Thereafter, a second contact 610 may be formed to penetrate the second and first interlayer dielectric layers 540 and 400 to come into connection with the second pad 320. A support layer 700 may be formed on the second interlayer dielectric layer 540, and may be formed by, for example, a chemical vapor deposition (CVD) process or the like. A first electrode 620 may be formed to penetrate the support layer 700 to come into connection with the second contact 610. A capacitor CA may be accomplished by forming a dielectric layer 630 conformally covering the first electrode 620, and forming a second electrode 640 covering the first electrode 620 with the dielectric 630 interposed therebetween. Thus, the capacitor CA may be disposed on the substrate 100 and connected to the second doping region SD2 through the second contact 610 and the second pad 320. Through the processes described above, a semiconductor memory device according to an exemplary embodiment of the present inventive concept may be manufactured.

According to a method of manufacturing a semiconductor memory device in accordance with an exemplary embodiment of the present inventive concept, the first work function adjusting layer 240 may have grains of which major axes are aligned in a direction perpendicular to the top surface of the first work function adjusting layer 240. The first work function adjusting material may be implanted into the first work function adjusting layer 240 through the top surface of the first work function adjusting layer 240, and when the major axes of the grains in the first work function adjusting layer 240 are aligned in a direction perpendicular to the top surface of the first work function adjusting layer 240, the first work function adjusting material may easily migrate into the first work function adjusting layer 240.

Since the first work function adjusting layer 240 has a second crystal plane, or a slip plane perpendicular to the top surface of the substrate 100, the first work function adjusting material may readily migrate through grain boundaries of the grains or through the second crystal plane into the first work function adjusting layer 240. Thus, it may be easy to dope the first work function adjusting material into the first work function adjusting layer 240, and also easy to form the first work function adjusting layer 240 having a low work function.

FIGS. 12 to 15 are cross-sectional views taken along lines I-I' and II-II' of FIG. 1, showing a method of manufacturing a semiconductor memory device according to an exemplary embodiment of the present inventive concept.

Figure 12:
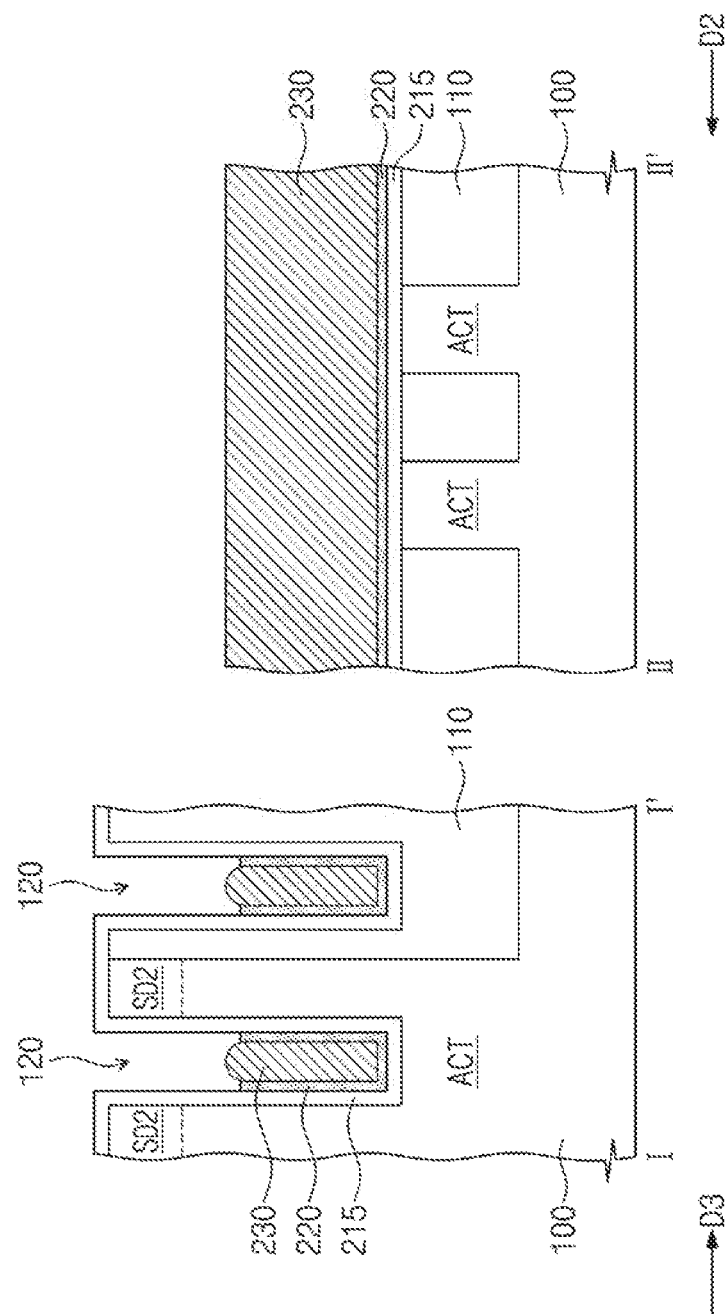
FIGS. 12 to 15 are cross-sectional views showing a method of manufacturing a semiconductor memory device according to an exemplary embodiment of the present inventive concept.

Referring to FIG. 12, an etching process may be performed on a resultant structure of FIG. 7. The etching process may partially remove a top end portion of the liner layer 220. Accordingly, the top surface of the liner layer 220 may become lower than the top surface of the conductive layer 230. For example, the conductive layer 230 may have a shape protruding beyond the top surface of the liner layer 220. The conductive layer 230 may be partially etched during the etching process. FIG. 12 shows that the top end portion of the conductive layer 230 is etched to have a convexly curved top surface facing upward, but the present inventive concept is not limited thereto. The conductive layer 230 may not be etched when the etching process is performed. For example, the top surface of the conductive layer 230 may remain flat, and the top end portion of the liner layer 220 may be etched to form a gap on a side of the conductive layer 230 with the gap interposed between the conductive layer 230 and the insluting layer 215. The gap may then be subsequently filled in with a low work function material to form a semiconductor memory device similar to that illustrated in FIG. 3. Hereinafter, an embodiment where the conductive layer 230 has the convexly curved top surface facing upward will be explained.

Figure 13:
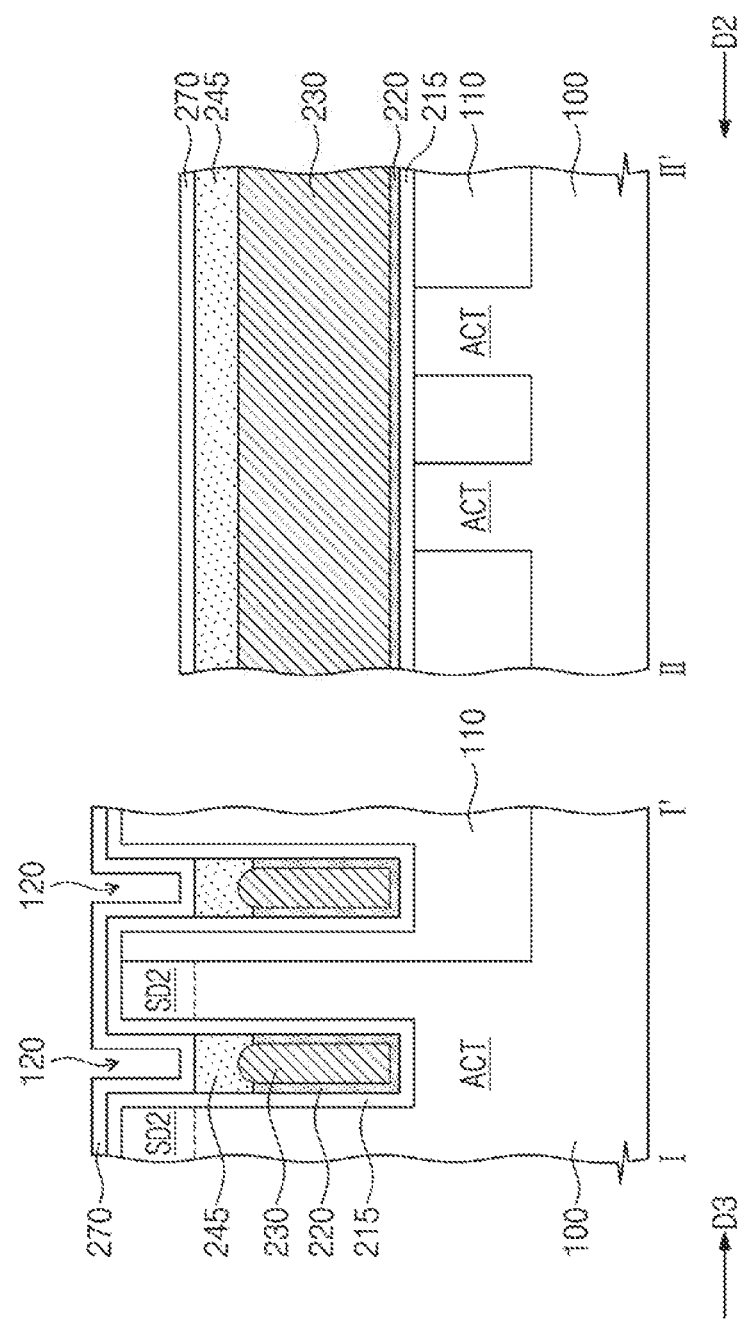

Referring to FIG. 13, the preliminary first work function adjusting layer 245 may be formed on the liner layer 220 and the conductive layer 230. For example, after the preliminary first work function adjusting layer 245 is formed on the substrate 100, an upper portion of the deposited preliminary first work function adjusting layer 245 may be etched. The preliminary first work function adjusting layer 245 may be in contact with the top surface of the conductive layer 230, and may extend between the conductive layer 230 and the insluting layer 215 to come into contact with the top surface of the liner layer 220. The preliminary first work function adjusting layer 245 may have a concavely curved bottom surface facing downward. The preliminary first work function adjusting layer 245 may be formed in such a way that its grains are directed toward a growth direction of the preliminary first work function adjusting layer 245, or toward a direction perpendicular to the top surface of the substrate 100. In addition, the preliminary first work function adjusting layer 245 may grow to have a slip plane parallel to the growth direction of the preliminary first work function adjusting layer 245, and may include, for example, a metallic material or a nitride thereof. A thickness of the preliminary first work function adjusting layer 245 may be controlled according to a work function required for the preliminary first work function adjusting layer 245.

The source material layer 270 may be formed on the substrate 100, and may be formed to conformally cover the insulating layer 215 and the top surface of the first work function adjusting layer 240. The source material layer 270 may include the first work function adjusting material. The first work function adjusting material may include a work function adjusting element or a compound thereof.

Figure 14:
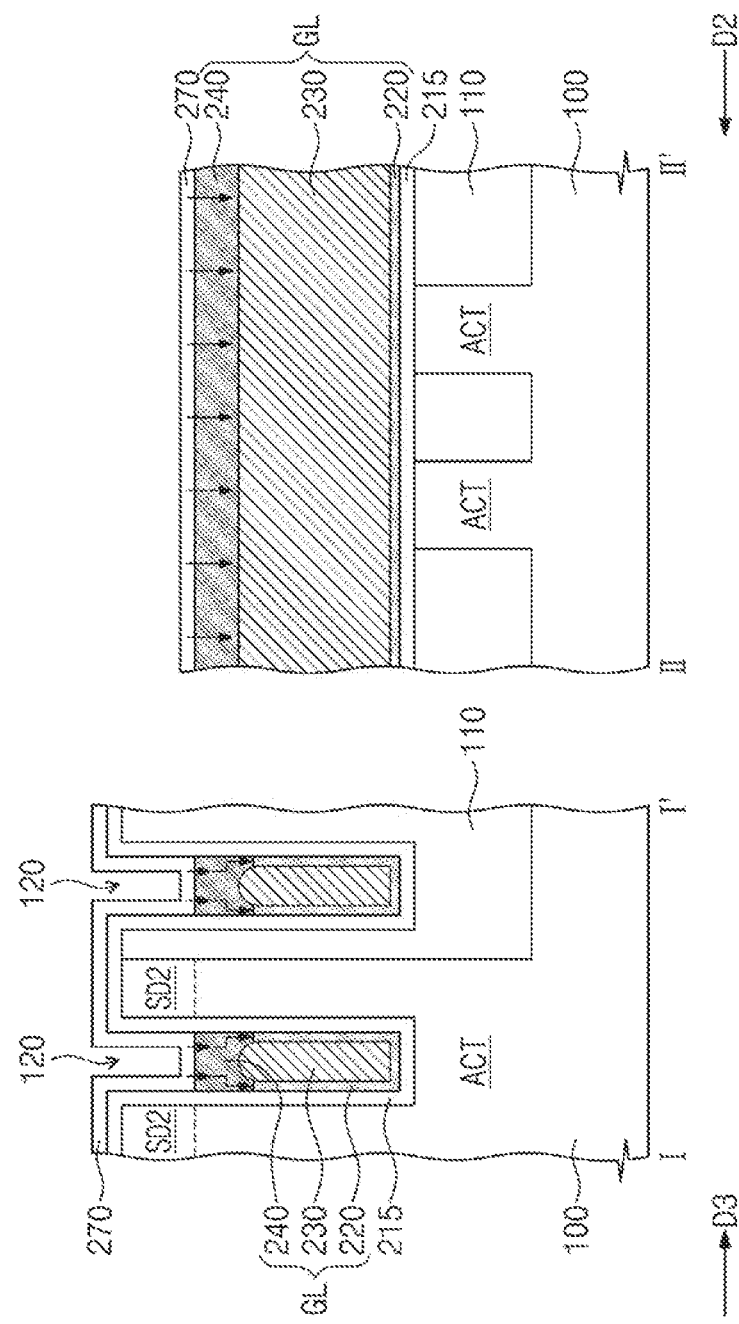

Referring to FIG. 14, the first work function adjusting material may diffuse into the first work function adjusting layer 240 from the source material layer 270. The diffusion of the first work function adjusting material into the first work function adjusting layer 240 may reduce a work function of the first work function adjusting layer 240. The first work function adjusting layer 240 into which the first work function adjusting material diffuses may have an effective work function less than those of the liner layer 220 and the conductive layer 230. An annealing process may be performed to cause the first work function adjusting material to diffuse from the source material layer 270 into the first work function adjusting layer 240 along arrows shown in FIG. 14. In an exemplary embodiment of the present inventive concept, the diffusion of the first work function adjusting material may still continue after the first work function adjusting layer 240 is entirely doped with the first work function adjusting material.

Figure 15:
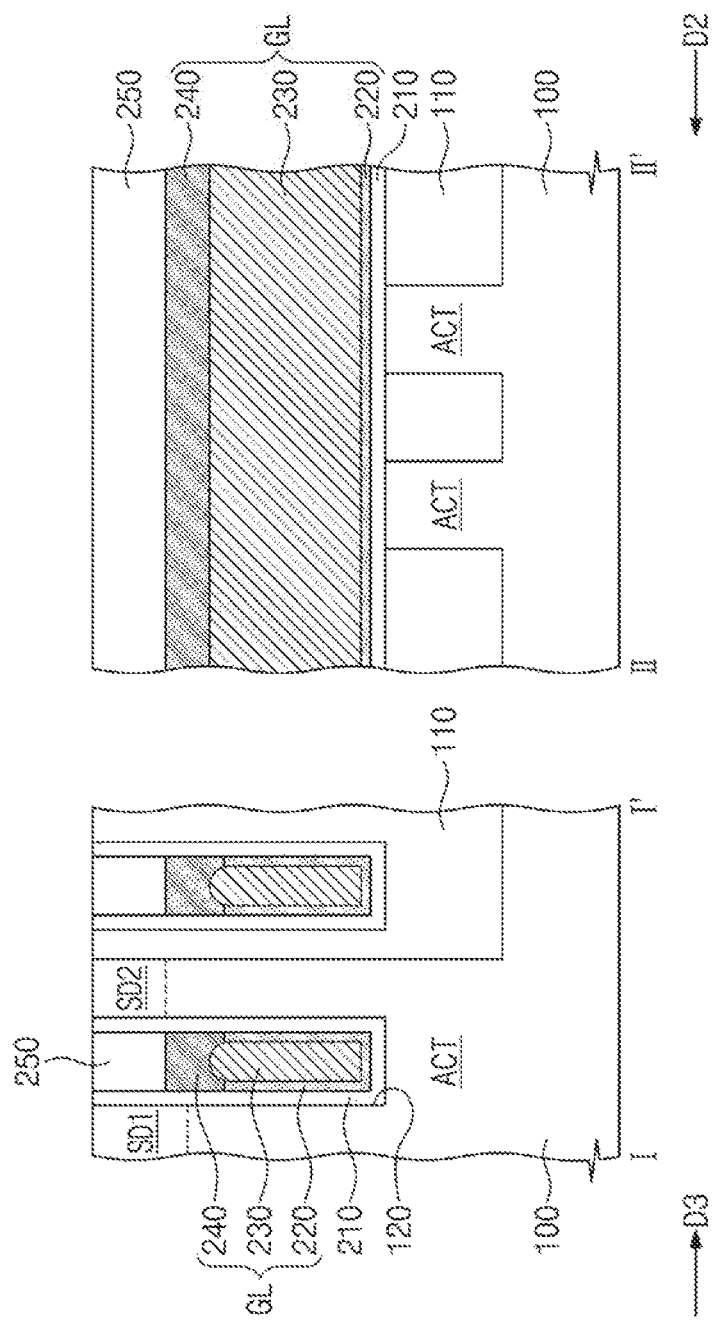

Referring to FIG. 15, the source material layer 270 may be removed. The removal of the source material layer 270 may reveal the insulating layer 215 and the top surface of the first work function adjusting layer 240.

After removing the source material layer 270, the first capping layers 250 may be formed in the trench 120. For example, a capping layer may be formed on the entire surface of the substrate 100, and then a planarization process may be performed on the capping layer, thereby forming the first capping layers 250. The planarization process may be a chemical mechanical planarization (CMP) process or an etch back process. In this step, the planarization process may remove a portion of the insulating layer 215 from the top surface of the substrate 100, thereby forming the gate dielectric layer 210. The planarization process may reveal top surfaces of the active regions ACT and a top surface of the device isolation layer 110.

An ion implantation process may be performed on the substrate 100 to form the first doping region SD1 in the active region ACT between two neighboring gate lines GL. The first doping region SD1 may extend deeper into the substrate 100 than the second doing region SD2.

After the ion implantation process, the process described with reference to FIG. 2A may be performed on a resultant structure of FIG. 15, and thus a semiconductor memory device according to an exemplary embodiment of the present inventive concept may be manufactured.

In a semiconductor memory device according to an exemplary embodiment of the present inventive concept, it may be possible to reduce a gate induced drain leakage current (GIDL) from the gate lines GL to the doping regions. Additionally, in order to reduce the leakage current, it may be easy to design the shape of the first work function adjusting layer 240 in accordance with a work function required for the first work function adjusting layer 240. For example, the first work function adjusting layer 240 of the gate line GL may be designed to have a low work function.

A work function may not be reduced below the gate lines GL of a semiconductor memory device according to an exemplary embodiment of the present inventive concept, and therefore a high threshold may be retained. For example, the work functions of the liner layer 220 and the conductive layer 230 may not be reduced and maintained high, so that the threshold voltage may also be maintained high.

In a method of manufacturing a semiconductor memory device according to an exemplary embodiment of the present inventive concept, it may be easy to dope the first work function adjusting material into the first work function adjusting layer 240, and also easy to form the first work function adjusting layer 240 having a low work function.

Although a few specific exemplary embodiments have been described, it will be understood by one of ordinary skill in the art that variations in form and detail may be made therein without departing from the spirit and scope of the present inventive concept as defined by the appended claims. The above disclosed exemplary embodiments should thus be considered illustrative and not restrictive.

What is claimed is:
1. A semiconductor memory device, comprising:
a device isolation layer defining active regions of a substrate; and
gate lines buried in the substrate and extending across the active regions,
wherein each of the gate lines comprises:
a conductive layer;
a liner layer disposed between and separating the conductive layer and the substrate; and
a first work function adjusting layer disposed on the conductive layer and the liner layer, the first work function adjusting layer comprising a first work function adjusting material,
wherein a work function of the first work function adjusting layer is less than those of the conductive layer and the liner layer,
major axes of grains in the liner layer are arranged in a direction parallel to a top surface of the substrate, and
major axes of grains in the first work function adjusting layer are arranged in a direction perpendicular to the top surface of the substrate.

* * * * *